(12) United States Patent
Herzinger et al.

(10) Patent No.: US 7,205,849 B2
(45) Date of Patent: Apr. 17, 2007

(54) PHASE LOCKED LOOP INCLUDING AN INTEGRATOR-FREE LOOP FILTER

(75) Inventors: Stefan Herzinger, München (DE); Günter Märzinger, Ulrichsberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/141,591

(22) Filed: May 31, 2005

(65) Prior Publication Data

US 2006/0114071 A1 Jun. 1, 2006

Related U.S. Application Data

(63) Continuation of application No. PCT/DE03/03638, filed on Nov. 3, 2003.

(30) Foreign Application Priority Data

Nov. 29, 2002 (DE) ................ 102 55 863

(51) Int. Cl.
*H03L 7/085* (2006.01)
*H03L 7/093* (2006.01)

(52) U.S. Cl. .................... 331/17; 331/25

(58) Field of Classification Search .......... 331/1 A, 331/8, 16–18, 25; 327/156–159; 329/325; 332/127; 360/51; 375/376; 455/260
See application file for complete search history.

(56) References Cited

U.S. PATENT DOCUMENTS

| 4,837,853 A * | 6/1989 | Heck .................. 455/208 |
| 4,918,404 A | 4/1990 | Vitiello et al. |
| 5,821,817 A | 10/1998 | McCorkle |
| 5,983,077 A | 11/1999 | Dent |
| 6,064,273 A | 5/2000 | Donohue |
| 6,462,593 B2 | 10/2002 | Wu et al. |
| 2003/0076177 A1* | 4/2003 | Fischer .................. 331/17 |

FOREIGN PATENT DOCUMENTS

DE 199 54 255 A1 6/2000
EP 0 856 946 A2 8/1998

OTHER PUBLICATIONS

"Electronic Filter Design Handbook", Arthur B. Williams, 1988, McGraw-Hill, XP0022275268, p. 3.16, Paragraph 2, Figure 3.13.
"Circuits and Systems for Wireless Communication", Chapter 10: *Transmitter Concepts, Integration and Design Trade-Offs*, Stefan Heinen and Stefan Herzinger, edited by Markus Helfenstein and George S. Moschytz, 2000, pp. 141-155.
"A 27-mW CMOS Fractional-N Synthesizer Using Digital Compensation of 2.5-Mb/s GFSK Modulation", Michael H. Perrott, Theodore L. Tewksbury III and Charles G. Sodini, IEEE Journal of Solid-State Circuits, vol. 32, No. 12, Dec. 1997, pp. 2048-2060.
International Search Report, Int'l Application No. PCT/DE03/03638, Int'l Filing Date Nov. 3, 2003, 2 pgs.

* cited by examiner

*Primary Examiner*—David Mis
(74) *Attorney, Agent, or Firm*—Eschweiler & Associates, LLC

(57) ABSTRACT

A phase locked loop PLL having a forward path and a feedback path is disclosed. A phase detector drives an oscillator in the forward path of the phase locked loop. The feedback path includes a frequency divider that connects the oscillator output to the phase detector. The phase locked loop further includes an integrator-free loop filter configured to control the oscillator. The integrator-free loop filter enables a reduction in the required PLL bandwidth without reducing the signal quality when the PLL is used as a modulator.

12 Claims, 2 Drawing Sheets

PHASE LOCKED LOOP INCLUDING AN INTEGRATOR-FREE LOOP FILTER

REFERENCE TO RELATED APPLICATIONS

This application is a continuation of PCT/DE03/03638, filed Nov. 3, 2003 which was not published in English, that claims the benefit of the priority date of German Patent Application No. DE 102 55 863.9, filed on Nov. 29, 2002, the contents of which both are herein incorporated by reference in their entireties.

FIELD OF THE INVENTION

The present invention relates to a phase locked loop.

BACKGROUND OF THE INVENTION

In telecommunications technology, the frequency of useful signals which are to be transmitted and are originally in baseband is normally shifted in order to be transmitted over a channel. In this case, a radiofrequency carrier signal is usually modulated using the useful signal. Phase locked loops, for example, can be used in order to convert the frequency of a useful signal of this type to radiofrequency. A prerequisite for this is that the modulation signal has a constant envelope.

Transmission arrangements of this type are also referred to as modulation loops.

A phase locked loop of the generic type is indicated, for example, in FIG. 2 on page 2049 of the document by Michael H. Perrott et al. "A 27-mW CMOS Fractional-N Synthesizer Using Digital Compensation for 2.5-Mb/s GFSK Modulation", IEEE Journal of Solid-State Circuits, Vol. 32, No. 12, December 1997.

In the case of phase locked loops (PLL) of this type, the phase detector is used to compare the phases of the oscillator signal whose frequency has been divided down and a reference signal. The oscillation frequency of the oscillator is changed, in a manner dependent on a phase and/or frequency deviation, in such a manner that the phase deviation disappears. The PLL is locked on in this state.

A loop filter is normally provided in order to couple the phase detector to the oscillator. From the point of view of control technology, this loop filter operates as a controller in the control loop and normally has integrating properties in order to maintain the stability of the control loop. Accordingly, the loop filter of a PLL is normally in the form of an I controller, a PI controller or a PID controller. In this case, the letter I represents the integrator in the controller.

A plurality of possible ways of introducing a modulation signal into a phase locked loop are known. Depending on the feeding-in point selected for the modulation signal, high-pass filter properties or low-pass filter properties result for the transfer function of the loop.

A high-pass filter transfer response of the loop results, for example, when the modulation signal is fed in at the input or at the output of the oscillator. It should be noted in this case that no technical implementation has hitherto yet been disclosed for feeding in a modulation signal at the output of the oscillator.

In contrast, a low-pass filter transfer response of the loop results when the modulation signal is fed in at one of the two inputs of the phase detector or at the output of the latter as well as when the modulation signal is fed in at the input of the frequency divider in the feedback path.

If one of the possible low-pass filter points in the control loop is used to feed in the modulation, the modulation signal is assessed using a low-pass filter function. This means that the modulation bandwidth is generally restricted to a value that is smaller than the loop bandwidth of the control loop. If, in contrast, a high-pass filter point is used, then the low frequencies of the modulation spectrum are attenuated in an unacceptable manner.

Chapter 10 "Transmitter Concepts, Integration and Design Trade-Offs", pages 141 to 155, of the document by Markus Helfenstein and George S. Moschytz "Circuits and Systems for Wireless Communication", Kluwer 2000, ISBN 0-7923-7722-2 specifies further possible ways of implementing modulation loops.

The modulators having a PLL which are cited have the disadvantage in common that a circuit node having low-pass filter properties is used to feed in the modulation signal. In addition, a very wide PLL bandwidth is needed to meet the high demands imposed on the quality of frequency conversion, as are called for in mobile radio standards, for example GSM.

The problems described could be solved by selecting a combination of a low-pass filter feeding-in point and a high-pass filter feeding-in point. Arrangements of this type are also referred to as two-point modulators.

However, the problem arises in this case that highly accurate adaptation is required between the low-pass filter modulation point (which is usually constructed using digital circuitry) at the frequency divider and the analog feeding-in node at the oscillator input. However, it is very complicated to effect this adaptation on account of manufacturing tolerances, temperature drifts etc. in the analog section.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase locked loop that is configured to modulate a carrier signal with low outlay and without substantial distortion.

According to the invention, the phase locked loop comprises an integrator-free loop filter that couples the output of the phase detector to the control input of the controlled oscillator.

In accordance with the present invention, no I component is provided in the controller of the phase locked loop, that is to say in the loop filter. Accordingly, the controller (which is in the form of a loop filter) of the PLL of the invention does not have an integrating property but rather is in the form of an integrator-free filter.

This overcomes a prejudice of the experts since integrating loop filters are normally always provided in phase locked loops which are suitable for mobile radio applications. These loop filters normally have one pole at zero in the complex transfer function, said pole being dispensed with in the present case. If the transfer function of a loop filter is transformed from the time domain to the Laplace domain, the so-called s plane, the I component of the loop filter can normally be represented by the factor 1/s. In accordance with the proposed principle, such a pole point at zero is avoided in the present case.

In a mathematical model of a phase locked loop, there is normally an integrating action in the oscillator, the transfer function of which is normally specified as K divided by s, K representing the transconductance of the oscillator and s representing the complex Laplace variable. In order to establish stability in the control loop, the double integrating action that therefore results in the prior art is normally compensated for by providing, in the loop filter, a zero point in the transfer function in addition to the integrator component.

In accordance with the present invention, omitting the I component (represented by the pole point in the transfer function of the loop filter) now also makes it possible to dispense with the zero point in the transfer function of the loop filter and nevertheless form a stable control loop.

In addition, in accordance with the present invention, the distortion (caused by the zero point) of the transfer function of the conventional closed loop is advantageously avoided. This in turn makes it possible to operate the phase locked loop in a stable manner, even with a relatively narrow loop bandwidth, without losses in the transmission quality.

In summary, the use of an integrator-free loop filter in a phase locked loop, as proposed in accordance with the present invention, makes it possible to optimize the loop filter for a very level profile of the group delay up to frequencies of the order of magnitude of the loop bandwidth itself.

The integrator-free loop filter may, for example, be implemented in the form of a loop filter having a complex-conjugate pole pair or having purely passive pole points. Passive pole points are also commonly referred to as real poles and are generated solely by passive circuits. Complex-conjugate poles, on the other hand, are formed by circuits that oscillate or by filter circuits that have active circuit elements, as is well known by those skilled in the art.

One embodiment of the invention provides for the integrator-free loop filter to comprise exclusively passive components. An integrator-free loop filter of this type can be implemented with particularly low outlay.

The loop filter is in one example of the invention described by a transfer function having at least one passive pole point in the Laplace plane. In accordance with one embodiment, the loop filter has exclusively passive pole points and therefore has neither zero points nor an integrator property. This makes it possible to realize a very level profile of the group delay of the transfer function of the closed loop.

The passive pole points are, in one example, implemented by means of a respective RC element. If a plurality of passive pole points are provided in the loop filter, a series circuit comprising a plurality of RC elements may be provided for the purpose of forming the passive poles.

In one alternative embodiment of the present invention, the integrator-free loop filter is in the form of a loop filter that is described by a transfer function having at least one complex-conjugate pole point pair in the Laplace plane. The embodiment as a loop filter having complex-conjugate pole points without zero points and without an integrator makes it possible to implement special advantageous transfer functions of the PLL such as Bessel or Legendre transfer functions.

In order to generate a voltage signal for feeding the integrator-free loop filter, it is advantageous to provide a controlled current source having a control input, which is connected to the output of the phase detector, and having a controlled path, which generates the output voltage signal using a connected load resistor.

This load resistor corresponds to the internal resistance of the equivalent voltage source and as such is advantageously part of the downstream loop filter. Such an embodiment of the phase locked loop can be used in a particularly advantageous manner in combination with an integrator-free loop filter having exclusively passive poles.

The described development of the phase locked loop with a controlled current source makes it possible to effectively insulate the output voltage of the phase detector from fluctuations in the supply voltage and at the same time makes it possible to dispense with a complex voltage regulator. In addition, the voltage swing that is possible in accordance with the proposed development is considerably larger than the voltage swing that is possible with a voltage regulator and practically extends over the entire supply voltage range.

The phase locked loop in accordance with the present principle may be employed in mobile radio devices, for example in mobile radio transmission arrangements, as well as in other applications.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail below using a plurality of exemplary embodiments and with reference to drawings, in which.

DETAILED DESCRIPTION OF THE INVENTION

Figure 1:
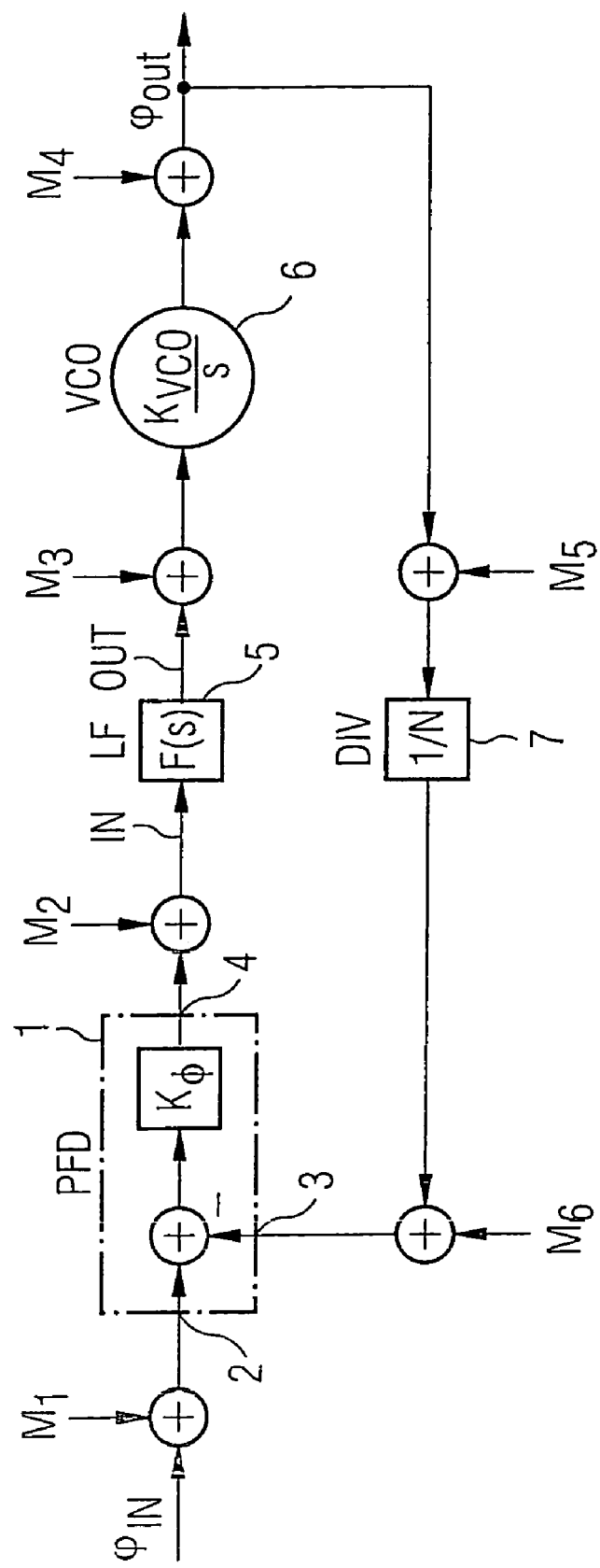
FIG. 1 is a block diagram illustrating a phase locked loop.

FIG. 1 shows a phase locked loop PLL. The phase locked loop comprises a forward path and a feedback path. A phase detector 1 having a first input 2, a second input 3 and an output 4 is provided in the forward path of the phase locked loop. A signal having a reference phase $\phi_{IN}$ can be supplied to the first input 2 of the phase detector 1.

The output 4 of the phase detector 1 is connected to the control input of a voltage-controlled oscillator 6 via an integrator-free loop filter 5. IN, OUT are used to designate the input and output of the loop filter 5. The output of the voltage-controlled oscillator 6, which has a transconductance $K_{VCO}$, forms the output of the phase locked loop. An output signal having an output phase angle $\phi_{OUT}$ can be tapped off at the output. The output of the phase locked loop is connected, via a frequency divider 7, to the second input 3 of the phase detector 1 so as to form negative feedback.

The difference between the phase angle of the input signal and the phase angle of the frequency-divided output signal that has been fed back is formed in the phase detector 1, and the oscillator 6 is driven in a manner dependent thereon. In accordance with the present invention, the oscillator 6 is driven by the phase and frequency detector 1 via the integrator-free loop filter 5. In the case of the phase locked loop described herein, the desired output frequency is set by adjusting the divider ratio of the frequency divider 7.

A modulation signal can be fed in at modulation points $M_1$ to $M_6$ of the phase locked loop. The modulation node $M_1$ is formed at the first input 2 of the phase detector 1, whereas the modulation point $M_2$ is provided at the output of the latter. The modulation point $M_3$ is provided at the input of the oscillator 6, and the modulation point $M_4$ is formed at the output of the latter. The modulation points $M_5$ and $M_6$ are provided at the input and at the output, respectively, of the frequency divider 7. As already explained at the outset, a high-pass filter transfer response results for the modulation points $M_3$ and $M_4$, whereas the modulation points $M_1$, $M_2$, $M_5$ and $M_6$ have low-pass filter transfer responses.

Depending on the modulation point at which a modulation signal is introduced into the PLL, different transfer functions result for the modulation signal:

for $M1$: $\quad \dfrac{\varphi_{out}}{M_1} = N \dfrac{1}{1 + \dfrac{s}{F(s)} \dfrac{N}{K_\phi K_{VCO}}}$ for $M2$: $\quad \dfrac{\varphi_{out}}{M_2} = \dfrac{N}{K_\phi} \dfrac{1}{1 + \dfrac{s}{F(s)} \dfrac{N}{K_\phi K_{VCO}}}$ for $M3$: $\quad \dfrac{\varphi_{out}}{M_3} = \dfrac{K_{VCO}}{s} \dfrac{1}{1 + \dfrac{F(s)}{s} \dfrac{K_\phi K_{VCO}}{N}}$ for $M4$: $\quad \dfrac{\varphi_{out}}{M_4} = \dfrac{1}{1 + \dfrac{F(s)}{s} \dfrac{K_\phi K_{VCO}}{N}}$ or $M5$: $\quad \dfrac{\varphi_{out}}{M_1} = \dfrac{1}{1 + \dfrac{s}{F(s)} \dfrac{N}{K_\phi K_{VCO}}}$ or $M6$: $\quad \dfrac{\varphi_{out}}{M_1} = N \dfrac{1}{1 + \dfrac{s}{F(s)} \dfrac{N}{K_\phi K_{VCO}}}$ where s is equal to the Laplace variable, F(s) is equal to the transfer function of the loop filter in the Laplace domain, N is equal to the divider factor of the frequency divider, $K_{VCO}$ is equal to the transconductance of the oscillator and $K_\phi$ is equal to the gain of the phase detector, respectively.

The integrator-free loop filter 5 of the present invention is configured as a controller of the phase locked loop. It does not have an I component. The transfer function of the loop filter 5 does not have any zero points in the Laplace domain. These properties of the loop filter 5 used make it possible to implement a phase locked loop having a very level profile of the group delay up to frequencies of the order of magnitude of the PLL bandwidth. This makes it possible, with a considerably narrower bandwidth than usual, to convert a signal from baseband to the radiofrequency band in a highly distortion-free manner using the PLL.

Figure 2:
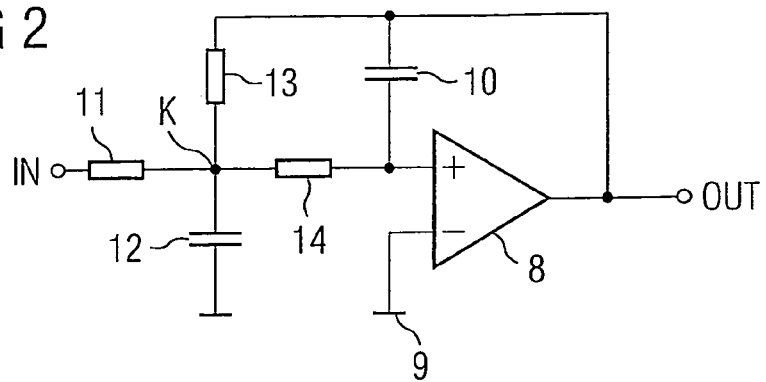
FIG. 2 is a schematic diagram illustrating a first exemplary embodiment of an integrator-free loop filter in accordance with the proposed invention for use in a PLL as shown in FIG. 1.

FIG. 2 shows a first exemplary embodiment of an integrator-free loop filter 5 in accordance with the present invention for use in a phase locked loop as shown in FIG. 1. In this case, provision is made of an operational amplifier 8 having two inputs, one of which is connected to a reference potential terminal 9. The further input of the operational amplifier 8 is connected, via a capacitor 10, to the output OUT of the loop filter, which is formed by the operational amplifier output. The input IN of the loop filter is connected to a circuit node K via an RC element. The RC element comprises a resistor 11 between the input IN of the loop filter and the circuit node K and also a capacitor 12, which is connected between the circuit node K and ground 9. The circuit node K is connected to the output OUT of the loop filter via a resistor 13 and is connected to the further input of the operational amplifier 8 via a resistor 14.

The integrator-free loop filter shown in FIG. 2 has a transfer function in the Laplace domain, which transfer function has a complex-conjugate pole point pair but no zero points. A loop filter of this type can be used to implement special preferred transfer functions of the phase locked loop such as, for example, Bessel or Legendre transfer functions.

Figure 3:
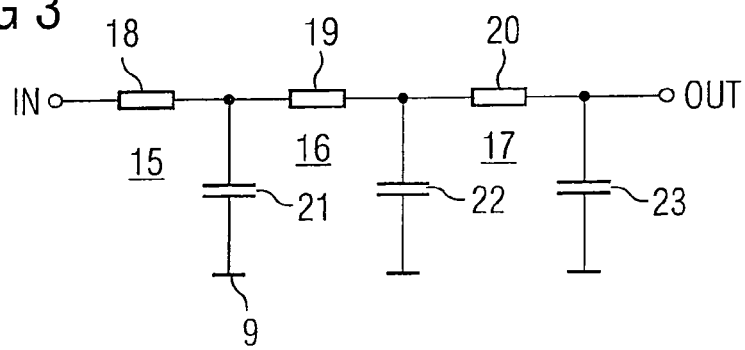
FIG. 3 is a schematic diagram illustrating a second exemplary embodiment of an integrator-free loop filter in accordance with the invention for use in a PLL as shown in FIG. 1.

One embodiment (which can be implemented with particularly low outlay) of an integrator-free loop filter in the sense of the present invention is shown in FIG. 3 and is likewise configured for use in a PLL as shown in FIG. 1. In the present case, a series circuit comprising a total of three RC elements 15, 16, 17 is formed between the input IN and the output OUT of the loop filter.

The RC elements 15, 16, 17 respectively comprise a series resistor 18, 19, 20 with a respective downstream capacitor 21, 22, 23 that is connected to reference potential 9. The three resistors 18, 19, 20 accordingly form a series circuit between the input IN and the output OUT of the loop filter.

The loop filter shown in FIG. 3 implements a transfer function with three passive pole points. In this case, the loop filter does not have any zero points in its transfer function and does not have an integrator. The loop filter shown in FIG. 3 can be implemented with particularly low outlay and likewise makes it possible to realize a very level profile of the group delay with the advantages—which have already been explained in detail—for the control loop having a modulator as shown in FIG. 1.

Figure 4:
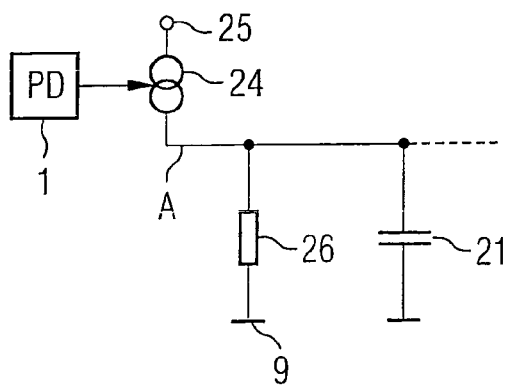
FIG. 4 is a schematic diagram illustrating an exemplary embodiment of a drive system of the loop filter of FIG. 3 having a controlled current source.

FIG. 4 shows an exemplary preferred circuit for driving the integrator-free loop filter 5 in accordance with the present invention, the circuit having a phase detector 1. For this purpose, provision is made of a controlled current source 24 whose control input is connected to the output of the phase detector 1. The terminals of the controlled path of the current source 24 are connected, on the one hand, to a supply potential terminal 25 and, on the other hand, to an output node A of the current source. In the circuit diagram of FIG. 4, a resistor 26 that is connected to the reference potential 9 is connected to the output A. A capacitor 21, which is connected to ground and is simultaneously part of the loop filter shown in FIG. 3, namely part of the input-side RC element 15 of FIG. 3, is furthermore connected to the output A.

The controlled current source 24 generates an output signal at a load resistor, said output signal being used to drive the loop filter. The load resistor corresponds to the internal resistance of the equivalent voltage source and as such is part of the downstream loop filter 5. In the embodiment shown in FIG. 4, the resistor 26, which is connected to the current source 24, corresponds to the entire requisite first filter resistor 18 of FIG. 3. Accordingly, the voltage swing needed to drive the loop filter is generated by a current source via a load resistor.

It is thus advantageously possible to dispense with a voltage regulator for stabilizing the phase detector output voltage. At the same time, the output voltage of the phase detector is insulated in a very effective manner from fluctuations in the supply voltage.

Figure 5:
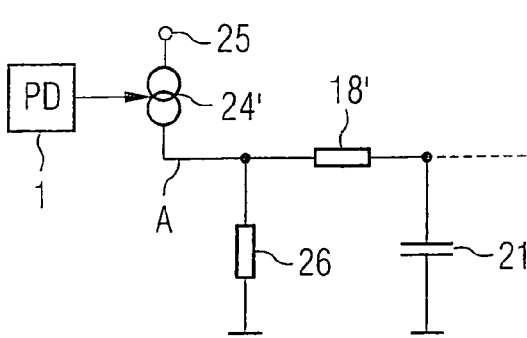
FIG. 5 is a schematic diagram illustrating a further embodiment of a circuit for driving an integrator-free loop filter as shown in FIG. 3.

FIG. 5 shows an alternative embodiment of a controlled current source 24' for coupling the loop filter to the output of the phase detector. This circuit largely corresponds, in terms of design and advantageous operation, to the circuit of FIG. 4 and is therefore not described again at this juncture. In the case of this circuit, the resistor 26, which is connected to the current source 24', is only part of the requisite first filter resistor 18 of FIG. 3. Accordingly, the terminal A of the current source 24' is connected to the capacitor 21 via a series resistor 18'. The series resistor 18', together with the capacitor 21 that is connected to ground, forms the input-side RC element 15 of FIG. 3.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

LIST OF REFERENCE SYMBOLS

1 Phase detector
2 Input
3 Input
4 Output
5 Loop filter
6 VCO
7 Frequency divider
8 Operational amplifier
9 Reference potential terminal
10 Capacitor
11 Resistor
12 Capacitor
13 Resistor
14 Resistor
15 RC element
16 RC element
17 RC element
18 Resistor
18' Resistor
19 Resistor
20 Resistor
21 Capacitor
22 Capacitor
23 Capacitor
24 Controlled current source
24' Controlled current source
25 Supply potential terminal
26 Resistor
IN Loop filter input
OUT Loop filter output
A Output node
K Circuit node

The invention claimed is:

1. A phase locked loop, comprising:
a phase detector comprising a first input configured to receive a reference signal, and a second input;
a controlled oscillator comprising a control input, and an output forming an output of the phase locked loop;
a frequency divider in a feedback path of the phase locked loop, the frequency divider comprising an input connected to the output of the controlled oscillator, and comprising an output connected to the second input of the phase detector; and
an integrator-free loop filter coupled between the output of the phase detector and the control input of the controlled oscillator, wherein the loop filter comprises a transfer function having at least one passive pole point in the Laplace plane.

2. The phase locked loop of claim 1, wherein the loop filter comprises exclusively passive components.

3. The phase locked loop of claim 1, wherein the at least one passive pole point is implemented by at least one associated RC element in the loop filter.

4. The phase locked loop of claim 1, wherein the loop filter transfer function further comprises at least one complex-conjugate pole point pair in the Laplace plane.

5. The phase locked loop of claim 4, wherein the loop filter comprises an operational amplifier.

6. The phase locked loop of claim 1, further comprising a controlled current source having a control input connected to the output of the phase detector, and comprising a controlled path connected between a supply potential terminal and an input of the loop filter.

7. The phase locked loop of claim 6, further comprising a resistor connected between the controlled current source and a reference potential.

8. A phase locked loop, comprising:
a phase detector configured to compare a reference signal to a divided feedback signal, and generate a control signal in response thereto;
a loop filter configured to receive the control signal and generate a tuning signal in response thereto, wherein the loop filter does not contain an integrating component, wherein the loop filter comprises:
an operational amplifier having a first input coupled to a reference potential, a second input, and an output forming an output of the loop filter;
a first capacitor coupled between the second input and the output of the operational amplifier;
a first resistor coupled between an intermediate node and the second input of the operational amplifier;
a second resistor coupled between the intermediate node and the output of the operational amplifier;

a second capacitor coupled between the intermediate node and the reference potential; and a third resistor coupled between an input of the loop filter and the intermediate node, wherein the second capacitor and the third resistor form an RC element, or wherein the loop filter comprises:

three series-connected RC elements extending between an input and an output of the loop filter, wherein each RC element comprises a resistor coupled between a respective input and a respective output, and a capacitor coupled between the respective output and a reference potential, or wherein the loop filter comprises:

a transfer function having a complex-conjugate pole point pair in the Laplace plane without zero points;

a controlled oscillator configured to generate a phase locked loop output signal having a frequency that is a function of the tuning signal; and a divider circuit in a feedback path configured to receive and divide down the phase locked loop output signal to form the divided feedback signal.

9. The phase locked loop of claim 8, wherein the loop filter comprises a transfer function having at least one passive pole in the Laplace plane.

10. The phase locked loop of claim 8, wherein the loop filter does not contain a pole at a zero location in the complex transfer function associated therewith.

11. A phase locked loop, comprising:

a phase detector configured to compare a reference signal to a divided feedback signal, and generate a control signal in response thereto;

a loop filter configured to receive the control signal and generate a tuning signal in response thereto, wherein the loop filter does not contain an integrating component;

a controlled oscillator configured to generate a phase locked loop output signal having a frequency that is a function of the tuning signal;

a divider circuit in a feedback path configured to receive and divide down the phase locked loop output signal to form the divided feedback signal; and a controlled current source having a control input coupled to the output of the phase detector, and having a controlled current path coupled between a supply potential and an input of the loop filter, wherein a current in the controlled current path is a function of the control signal of the phase detector at the control input.

12. The phase locked loop of claim 11, further comprising a load resistor coupled between the input of the loop filter and a reference potential, and configured to convert the current in the controlled current path to a voltage.

* * * * *